US009177644B2

(12) United States Patent
Tsao et al.

(10) Patent No.: US 9,177,644 B2
(45) Date of Patent: Nov. 3, 2015

(54) LOW-VOLTAGE FAST-WRITE PMOS NVSRAM CELL

(71) Applicants: Hsing-Ya Tsao, San Jose, CA (US); Peter Wung Lee, Saratoga, CA (US)

(72) Inventors: Hsing-Ya Tsao, San Jose, CA (US); Peter Wung Lee, Saratoga, CA (US)

(73) Assignee: Aplus Flash Technology, Inc.

( * ) Notice: Subject to any disclaimer, the term of this patent is extended or adjusted under 35 U.S.C. 154(b) by 141 days.

(21) Appl. No.: 13/965,031

(22) Filed: Aug. 12, 2013

(65) Prior Publication Data

US 2014/0050025 A1 Feb. 20, 2014

Related U.S. Application Data

(60) Provisional application No. 61/742,683, filed on Aug. 15, 2012.

(51) Int. Cl.
*G11C 14/00* (2006.01)
*G11C 16/04* (2006.01)
*G11C 16/16* (2006.01)

(52) U.S. Cl.
CPC ............ *G11C 14/0063* (2013.01); *G11C 14/00* (2013.01); *G11C 16/04* (2013.01); *G11C 16/0433* (2013.01); *G11C 16/16* (2013.01)

(58) Field of Classification Search
CPC .... G11C 14/0063; G11C 16/04; G11C 14/00; G11C 16/0466; G11C 5/141; G11C 11/417
See application file for complete search history.

(56) References Cited

U.S. PATENT DOCUMENTS

| | | | |
|---|---|---|---|
| 4,703,456 A | 10/1987 | Arakawa | |
| 5,065,362 A | 11/1991 | Herdt et al. | |
| 5,563,839 A | 10/1996 | Herdt et al. | |
| 5,602,776 A | 2/1997 | Herdt et al. | |
| 5,828,599 A | 10/1998 | Herdt | |
| 5,903,561 A | 5/1999 | Kwon | |
| 5,909,392 A * | 6/1999 | Chang et al. | 365/185.12 |
| 6,026,018 A | 2/2000 | Herdt et al. | |
| 6,097,629 A | 8/2000 | Dietrich et al. | |
| 6,285,586 B1 | 9/2001 | Lung et al. | |
| 6,414,873 B1 | 7/2002 | Herdt | |
| 7,110,293 B2 | 9/2006 | Jung | |
| 7,164,608 B2 | 1/2007 | Lee | |
| 7,269,054 B2 | 9/2007 | Kang et al. | |
| 7,280,397 B2 | 10/2007 | Scheuerlein | |
| 7,408,801 B2 | 8/2008 | Kang et al. | |
| 7,505,303 B2 | 3/2009 | Ashokkumar et al. | |
| 7,518,916 B2 | 4/2009 | Ashokkumar et al. | |
| 7,539,054 B2 | 5/2009 | Ashokkumar et al. | |
| 7,663,917 B2 | 2/2010 | Cuppens et al. | |

(Continued)

*Primary Examiner* — J. H. Hur
*Assistant Examiner* — Ajay Ojha
(74) *Attorney, Agent, or Firm* — Fang Wu

(57) ABSTRACT

This invention discloses a low-voltage fast-write 12T or 14T PMOS NVSRAM cell structure which comprises a 6T LV SRAM cell and one pairs of two 3T or 4T HV PMOS Flash strings. Due to reverse threshold voltage definition of PMOS and NMOS flash cell, this PMOS NVSRAM cell has the advantage over the NMOS NVSRAM cell to have the same data polarity between SRAM and Flash pairs during the data writing operation. In addition, this PMOS NVSRAM's PMOS Flash cell uses similar low-current FN-tunneling scheme as NMOS NVSRAM, thus the fast data program and erase can be achieved in a big density up to 100 Mb simultaneously. As a result, low power voltage operation of NVSRAM with 1.2V VDD can be much easier to be designed without coupling the FSL line to any VDD level during the flash data loading into SRAM cell during a power-on period.

20 Claims, 9 Drawing Sheets

(56) References Cited

U.S. PATENT DOCUMENTS

| | | |
|---|---|---|
| 7,710,776 B2 | 5/2010 | Johal et al. |
| 7,760,540 B2 | 7/2010 | Still |
| 7,859,899 B1 | 12/2010 | Shakeri et al. |
| 7,890,804 B2 | 2/2011 | Mann et al. |
| 8,018,768 B2 | 9/2011 | Shih et al. |
| 8,036,032 B2 | 10/2011 | Scade et al. |
| 8,331,134 B2 | 12/2012 | Chiu et al. |
| 8,861,271 B1 * | 10/2014 | Zain et al. ................. 365/185.07 |
| 2006/0023503 A1 * | 2/2006 | Lee .......................... 365/185.05 |
| 2008/0151654 A1 * | 6/2008 | Allan et al. .............. 365/189.16 |
| 2009/0190402 A1 * | 7/2009 | Hsu et al. ................. 365/185.08 |
| 2012/0155187 A1 * | 6/2012 | Shelton et al. ........... 365/185.33 |

\* cited by examiner

| Voltage | BL | SG1 | FWL | SG2 | FSL | Psub | Scheme |
|---|---|---|---|---|---|---|---|
| Erase | VSS | VSS | -18V | VDD | VSS | VSS | FN (Channel) |
| Program Inhibit (selected WL) | VDD | VDD | +18V | VSS | VDD/VSS | VSS | No FN |
| Program | VSS | VDD | +18V | VSS | VDD/VSS | VSS | FN (Channel) |

FIG. 1D
(Prior Art)

| Voltage | BL | SG1 | WL | SG2 | SL | Psub | Scheme |
|---|---|---|---|---|---|---|---|
| Erase | VSS | VSS | -7V | VDD | VSS | VSS | FN (Channel) |
| Program Inhibit (selected WL) | VDD | VDD | +7V | VSS | VDD/VSS | VSS | No FN |
| Program | VSS | VDD | +7V | VSS | VDD/VSS | VSS | FN (Channel) |

FIG. 2D
(Prior Art)

| Voltage | BL | BLB | Q | QB | SWL | NW | Pass | SG1 | FWL | SG2 | FSL | Scheme |
|---|---|---|---|---|---|---|---|---|---|---|---|---|
| Flash Erase | X | X | X | X | X | VSS | VSS | VDD | VPP | -5V | VSS | FN (Channel) |
| Flash Program | X | X | VSS/VDD | VDD/VSS | VSS | VDD | VDD+2V | VSS | VNN | VSS | VSS | FN (Channel) |
| Flash Program Inhibit | X | X | VSS/VDD | VDD/VSS | VSS | VDD | VDD+2V | VSS | VNN | VSS | VSS | No FN |
| SRAM Read | X | X | X | X | VDD | VDD | VSS | VDD | VSS | VSS | VSS | No FN |
| Data Loading from Flash to SRAM | X | X | X | X | VSS | VDD | VDD+2V | -5V | VSS | -5V | VSS | No FN |

FIG. 3B

NVSRAM Cell Operation Timeline

LOW-VOLTAGE FAST-WRITE PMOS NVSRAM CELL

CROSS-REFERENCES TO RELATED APPLICATIONS

This application claims priority to U.S. Provisional Patent Application No. 61/742,683, filed on Aug. 15, 2012, commonly assigned, and hereby incorporated by reference in its entirety herein for all purposes.

This application is related to U.S. Pat. Nos. 8,018,768, 7,760,540, 7,110,293, and 7,859,899.

BACKGROUND OF THE INVENTION

The present invention is generally related with a novel design of PMOS SRAM based NVRAM cell structure and array for an extremely fast Write (Program and Erase) speed, which only requires the low-voltage VDD and VSS for Program and Program-Inhibit operations for an extremely high-density, low-current, in-circuit programmable and erasable NVSRAM and SRAM-based field-programmable gate array (FPGA) designs.

The CMOS NVSRAM is well known for years in the art. Typically, it comprises a 6T SRAM cell and a Flash cell. During the read operation, Flash is isolated from SRAM and is transparent to the SRAM users. But the SRAM lacks of permanent storage capability after the normal power off or the unexpected power loss. Therefore, there is a need to back up all data that is being stored in all on-chip volatile SRAM into the nonvolatile Flash on the same die within a very short period of time. NVSRAM prevails over NVDRAM in market place because it does not consume any power as NVDRAM for the data refreshment during the read operation.

Three prior arts related to NVSRAM cells are referred to for this application, including a U.S. Pat. No. 7,164,608 related to 1-poly NVSRAM, a U.S. Pat. No. 7,760,540 (filed by a same inventor as the present application and commonly assigned) related to 2-poly NVSRAM, and a U.S. patent application Ser. No. 13/888,134 (filed by the same inventor of the present application) related to low voltage fast-write NVSRAM cell.

All these prior works are actually related to the NMOS NVSRAM cell because they uses NMOS flash transistor as the storage NVM transistor, regardless of 1-poly charge trapping SONOS type or 2-poly floating-gate type flash cell. Although the NMOS NVSRAM cells have many advantages, there is one severe drawback which is the reverse of the polarity of stored data between each SRAM and each Flash cell in each NVSRAM cell after program operation of each NMOS NVSRAM. As a result, during the power-up period, the downloading of each Flash data into each corresponding SRAM cell needs more complicate circuit handling technique to make it into the same data polarity. Or as in the U.S. patent application Ser. No. 13/888,134, more transistors were added to eliminate the reverse polarity with a simple write circuit but at the sacrifice of larger silicon area overhead.

Therefore, an improved PMOS NVSRAM cell design and associated operations are needed and become objectives of the present invention.

BRIEF SUMMARY OF THE INVENTION

The present invention is generally related to a design of PMOS SRAM-based NVRAM cell structure and array for an extremely fast Write (Program and Erase) speed, which only requires the low-voltage VDD and VSS for Program and Program-Inhibit operations for an extremely high-density, low-current, in-circuit programmable and erasable NVSRAM and SRAM-based FPGA design. Particularly, unlike the previous NMOS NVSRAM cells invented by the same inventors (commonly assigned to Aplus Flash Technology), the PMOS NVSRAM cell structure can be used extensively to those applications of SRAM-based FPGA IC design with a fast speed of as low as 10 ms simultaneously chip write on an extremely high memory density of up to 1 Gb at read operation with a low VDD down to 1.2V.

More specifically, this invention is to provide a new PMOS NVSRAM cell structure which is preferably comprised of one LV SRAM cell and one HV Flash cell. The SRAM cell of NVSRAM comprises 6T SRAM CMOS transistors with two LV PMOS devices and four LV NMOS devices. The Flash cell preferably comprises one paired 3T PMOS Flash strings. Each PMOS Flash string further comprises three PMOS devices preferably connected in series with two inputs connected to the paired outputs of Q and QB of each SRAM cell. The three PMOS devices comprise two 1-poly PMOS Select devices and one 2-poly floating-gate PMOS Flash storage device. The Flash floating-gate device is being sandwiched by the two PMOS Select devices. The two Flash cells in two Flash strings store the complementary threshold voltages Vts, Vt0 and Vt1. The Vt0 is preferably set to be −2.0V and Vt1 is set to be 1.0V. In order to secure Flash Erase operation without causing current leaking from either Q or QB node at VDD to the Flash cell common N-well at ground, two more CMOS transistors may be added as Pass (control) transistors provide desired isolation between the SRAM cell and the Flash cell. Thus, the total number of transistors (T) of the present invention of each PMOS NVSRAM cell can be either 12 or 14 depending on the Read and Write speed consideration.

Each PMOS NVSRAM cell structure and array biased conditions have been optimized with a design goal to meet the lower Write HV voltage but faster Write speed, transferring each LV volatile SRAM cell data into each corresponding HV non-volatile Flash cell during the normal or unexpected power down mode or writing from each HV non-volatile Flash cell into each corresponding volatile SRAM during normal VDD power-up, collectively and simultaneously, for whole extremely high-density field-programmable gate array (FPGA).

During the normal SRAM Read operation of each PMOS NVSRAM cell of the present invention, each Flash cell is totally isolated from each 6T SRAM cell from electrical circuit viewpoint. As a result, each Flash cell is totally transparent to each corresponding SRAM within each PMOS NVSRAM cell so that the performance of SRAM Read and Write operations of each NVSRAM cell is aimed to achieve the performance like the regular Read and Write of SRAM cell.

During the channel FN Program operation of this PMOS NVSRAM cell, the data is defined to be written from each SRAM cell onto each corresponding Flash cell. As oppose to the prior NMOS NVSRAM cell, the paired outputs, Q and QB, of each SRAM cell provide a paired LV Program voltage (VDD) and Program-Inhibit voltage (VSS) so that each PMOS NVSRAM's Flash string pair can be quickly, correctly, and collectively programmed into the desired complementary Vt states without reversing the data polarity during the low-voltage 1.2V VDD Read operation.

By contrast, the channel FN Erase operation of this PMOS NVSRAM cell, the paired Flash cells in the paired Flash strings would be erased collectively with the same Vt0. Only after the FN channel program operation, the selected paired Flash cells' Vt in each PMOS NVSRAM cell would become complementary.

The first objective of this invention is to provide a structure of a 14T PMOS NVSRAM cell that comprises at least two parts. The first part is the 1-bit of 6T SRAM cell and the second part is the 1-bit of 6 T PMOS Flash cell. The 6T SRAM cell further comprises two LV PMOS devices and four LV NMOS devices with one common WL and two complementary BLs such as BL and BLB. The 6T PMOS Flash cell comprises 1-bit of a pair of Flash strings stored with two complementary Vts. Each Flash string further comprises three (3) HV PMOS transistors (3 T) with one 2-poly Flash cell (1T) sandwiched by two PMOS 1-poly Select transistors (2T) with the paired inputs connected to the paired outputs, Q and QB nodes, of the 6T SRAM cell. Each 3T Flash string is associated with one 1T LV NMOS transistor with gate tied to a PASS signal which is inserted between an 1-poly Select transistor of the 3T Flash string and one of the paired outputs, Q and QB nodes, of the 6T SRAM cell.

The second objective of this invention is to provide a method to increase the Flash cell's WL coupling ratio from top Poly2 control gate to the Poly1 floating-gate to reduce the required WL positive or negative voltage so that the ramping time for both Program and Erase voltage can be reduced for more secure backup of each SRAM cell's volatile data into the non-volatile Flash cell of the present PMOS NVSRAM cell.

The third objective of this invention is to make the equivalent pull-down resistance of 3T PMOS devices of each long Flash string lower than the PMOS pull-up resistance of each corresponding SRAM cell with sufficient margin to allow the quick and safe data loading from each Flash cell into each corresponding SRAM cell of each NVSRAM cell, operating as low as 1.2V VDD.

The fourth objective of the present PMOS NVSRAM invention is to use one of three HV PMOS transistors to isolate each input of each Flash cell from the paired Q and QB of each LV SRAM cell of each PMOS NVSRAM cell so that the boosting negative HV within the PMOS Flash channel during the SBPI Program operation would not be coupled to any P/N junction of each LV SRAM cell to avoid junction breakdown.

The fifth objective of the present PMOS NVSRAM cell invention is to provide one preferred set of Erase and Erase-Inhibit bias conditions by coupling the PMOS Flash gate voltage, FWL, with a positive high voltage (HV) along with coupling the PMOS Flash cell's Source and Drain nodes as well its N-well node to 0V. As a result, the electrons in the Flash channel would be injected into the poly1 floating-gate, allowing for the low-current channel FN tunneling effect on both two PMOS Flash cells in the two 3 T PMOS Flash strings.

The sixth objective of the present PMOS NVSRAM cell invention is to provide one preferred set of Program and Program-Inhibit bias conditions by coupling the PMOS Flash gate voltage, FWL, with a negative high voltage along with 0V and a boosted negative meddle-level voltage in the Program and Program-Inhibit PMOS Flash cells. As a result, the electrons stored in the floating-gate of the selected Program Flash cell in one string would be expelled out, while in the selected Program-Inhibit PMOS Flash cell in the complementary string, the stored electrons would remain the same without being tunneled.

The seventh objective of this PMOS NVSRAM cell array is to provide a preferred timeline to show how to correctly and simultaneously program each SRAM cell's data into each PMOS Flash cell of each PMOS NVSRAM cell.

The eighth objective of this PMOS NVSRAM cell array is to provide a preferred timeline to show how to correctly and simultaneously program each SRAM cell's data into each PMOS Flash cell of each PMOS NVSRAM cell during the desired or undesired power down or power loss by detecting the dynamic VDD drop voltage.

The ninth objective of this PMOS NVSRAM cell array is to provide a preferred timeline to show how to correctly and simultaneously program each PMOS Flash cell's data into each SRAM cell of each PMOS NVSRAM cell.

The tenth objective of this PMOS NVSRAM cell array is to provide a preferred timeline to show how to correctly and simultaneously erase two PMOS Flash cells of each PMOS NVSRAM cell.

The eleventh objective of this invention is to provide a preferred timeline to show how to correctly read each SRAM cell out from each PMOS NVSRAM cell with two PMOS Flash cells in the two 3T PMOS strings equivalently out of circuit.

In a specific embodiment, the present invention provides a 14T PMOS NVSRAM memory cell circuit with low-voltage (LV) fast-write scheme. The 14T PMOS NVSRAM memory cell includes a SRAM cell comprising six LV CMOS transistors operated at a VDD voltage as low as 1.2 V. The six LV CMOS transistors includes a pair of LV NMOS transistors sharing a first word line and respectively coupling between a first bit line and a first data node and between a second bit line and a second data node. The first data node and the second data node respectively are coupled to two cross-coupled invertors made by another two LV NMOS transistors and two LV PMOS transistors. Additionally, the 14T PMOS NVSRAM memory cell includes a Flash cell comprising a first Flash string of three PMOS transistors and a second Flash string of three PMOS transistors sharing a common N-well region. The first/second Flash string includes a first/second top Select transistor, a first/second Flash transistor, and a first/second bottom Select transistor connected in series. The first and the second top Select transistors are gated commonly by a first select-gate control line and respectively associated with a first drain terminal and a second drain terminal. The first and the second bottom Select transistors are gated commonly by a second select-gate control line and respectively associated with a first source terminal and a second source terminal. The first and the second Flash transistors are gated commonly by a second word line for controlling two complementary charge states. The first source terminal and the second source terminal are connected together to a flash source line. The first drain terminal and the second drain terminal are respectively connected to the first data node and the second data node. Furthermore, the 14T PMOS NVSRAM memory cell includes a pair of Pass transistors respectively disposed to set up a connection in series between the first data node and the first drain terminal and a separate connection in series between the second data node in series and the second drain terminal. In an embodiment, the pair of Pass transistors are commonly gated by a pass-control line to provide two direct routes of writing data of the SRAM cell via a FN-tunneling effect respectively from the first data node and the second data node collectively to the first Flash transistor and the second transistor of the Flash cell in two complementary threshold voltage states without reversing data polarity by setting a negative high voltage VNN ranging from about −12V to about −18V the second word line with the common N-well region being set to the VDD voltage.

In an alternative embodiment, the present invention provides a method for operating a PMOS NVSRAM memory cell with a low power-voltage VDD. The method includes coupling a first word line of both a first data node and a second data node of a SRAM cell through common gates of a first access NMOS transistor and a second access NMOS transistor. The method further includes providing a first Flash string of three-PMOS transistors and a second Flash string of three-PMOS transistors respectively connecting in series with the first data node and the second data node. Each Flash string includes a Flash transistor sandwiched by a top select-gate transistor and a bottom select-gate transistor. Both Flash strings are configured to be a Flash cell sharing a common N-well region and a common source line. Additionally, the method includes coupling a second word line to common gates of the pair of Flash transistors, coupling a first select-gate control line to common gates of the pair of top select-gate transistor, and coupling a second select-gate control line to common gates of the pair of bottom select-gate transistor. Furthermore, the method includes executing one or more PMOS NVSRAM cell operations including a data-loading operation to write data from the Flash cell into the SRAM cell following a timeline after ramping up of the power voltage VDD from 0V to a desired low voltage VDD level ranging from 1.2 V to 1.8V. In an embodiment, the data-loading operation includes keeping the first word line to 0V, applying −5V to the first select-gate control line, setting the second word line to 0V, applying −5V to the second select-gate control line, and setting the common N-well region at the VDD level, thereby the data-loading operation forming a conduction state in a Flash transistor having a channel threshold voltage of −2.0V in association with the first/second Flash string to set 0V level to the corresponding first/second data node and also forming a non-conduction state in another Flash transistor having a channel threshold voltage of +2.0V in association with the first/second Flash string to set the VDD level to the corresponding first/second data node.

In the PMOS NVSRAM cell provided in the current application, the addition of extra MOS transistors for keeping the same data polarity are eliminated due to the inherent data reverse when using PMOS Flash cell of this invention to replace the NMOS Flash cell used in a prior application. As a result, this PMOS NVSRAM cell structure design can achieve the smallest cell size with a simple write control circuit without any extra overhead.

Besides the above advantage of correcting the reverse data polarity between Read and Program operation in prior art, there are some other advantages of this PMOS NVSRAM cell design of present invention are summarized below:

a) Although this is a PMOS NVSRAM cell, it still uses the low-current channel FN tunneling effect for both Program and Erase operations. Thus, extremely high-density NVSRAM cells can be performed simultaneously and collectively as NMOS NVSRAM cell array.

b) Like a NMOS NVSRAM cell, the LV VDD and VSS Program and Program-Inhibit voltages coupling from each SRAM's paired Q and QB outputs to the paired Flash strings' inputs are same as NMOS NVSRM cells, thus the operation of writing from SRAM cell into PMOS Flash cell is very effective and simple and power saving.

c) No addition of extra MOS device along the paths of paired Flash inputs to Q and QB of SRAM cell's input makes the data loading from PMOS Flash cell to SRAM cell simpler and power saving, particularly when operating at lower VDD level down to 1.2V.

d) The Program-Inhibit operation in this PMOS NVSRAM cell is based on the SBPI (Self Boosting Program-Inhibit approach) as the one used in the NMOS NVSRAM cell. The difference is that a negative-voltage is induced in PMOS Flash cell by ramping down the voltage of the PMOS Flash gate.

Many benefits can be achieved by applying the embodiments of the present invention. These and other benefits may be described throughout the present specification and more particularly below.

BRIEF DESCRIPTION OF THE DRAWINGS

FIG. 1D is a table that provides a set of bias conditions for various key NMOS NVSRAM operations including Erase and Program and Program-Inhibit of the Flash cell and Read of the SRAM cell of the NVSAM cell of prior art.

FIG. 2D is a table that provides another set of bias conditions for various key 1-poly NMOS NVSRAM operations of FIG. 2C.

FIG. 3B is a table that provides a preferred set of bias conditions for various key PMOS NVSRAM operations according to an embodiment of the present invention.

DETAILED DESCRIPTION OF THE INVENTION

The present invention is generally related with a novel design of PMOS SRAM based NVRAM cell structure and array for an extremely fast Write (program and erase) speed but with only requires the low-voltage VDD and VSS for Program and Program-Inhibit operation for an extremely high-density, low-current, in-circuit programmable and erasable NVSRAM and SRAM-based FPGA designs. More particularly, unlike the previous NMOS NVSRAM cells invented by the same inventors and others, this preferred PMOS NVSRAM cell structure can be used extensively to those applications of SRAM-based FPGA IC design with a fast 10 ms simultaneously chip write on an extremely high memory density of up to 1 Gb at a low VDD read operation down to 1.2V.

Figure 1A:
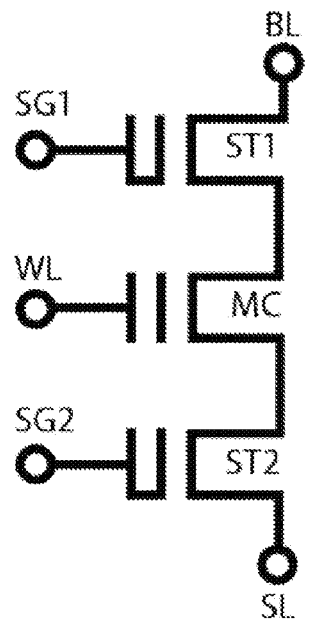
FIG. 1A is a schematic diagram of a 3T NMOS Flash string used in a NMOS NVSRAM cell of prior art.

To better illustrate the preferred PMOS NVSRAM cell, a revisit of some structures NVSRAM cells presented in prior art would be helpful. FIG. 1A is a schematic diagram of a 3T NMOS Flash string used in a NMOS NVSRAM cell of prior art. Presenting this traditional NVSRAM cell diagram is merely used as part of an inventive process as described below. As seen, FIG. 1A shows a schematic diagram of one of the 3T NMOS Flash string, Fstring1 or Fstring2, used in a NMOS NVSRAM cell of prior art. The NMOS Flash string consists of two 1-poly HV NMOS Select transistors, ST1 and ST2, and one 2-poly floating-gate type NMOS flash transistor, MC. The 1-poly Select transistor is formed by shorting the Poly2 control-gate to Poly1 floating-gate. Three transistors of each FString are connected in series from the drain node of BL to the source node of SL. The channel widths of three transistors are either made the same or different, depending on the applications and design specs.

There are pros and cons for such a cell structure of 3T NMOS Flash string of the FIG. 1A as summarized below.

1) Cons:
  a) The effective cell size is increased in layout: If the 3T Flash string structure of FIG. 1A is used to replace the 1 T flash cell, each flash part of each NMOS NVSRAM cell takes more area due to the transistor number's increase from one to three.
  b) It is due to the adding resistance from the top and bottom 1-poly Select NMOS transistors, ST1 and ST2, connected in series with the NMOS Flash cell, MC, placed in the middle. Typically, the 3T NMOS Flash string current is smaller than the 1T flash cell by 30% if all transistors are made with same channel width.
2) Pros:
  a) Only the low-voltage VDD Program-Inhibit voltage and the VSS Program voltage are required at BL node during this NMOS flash FN-channel program operation:
    The 3T Flash string of FIG. 1A adopts the common Self-Boosting Program Inhibit (SBPI) scheme that just needs VDD to be coupled to the top terminal used extensively in NAND but with a much long cell string. When VSS is coupled to the top terminal of the 3T NMOS flash string, the selected flash cell would be programmed to achieve higher Vt1 of more than 2.0V after the predetermined program cycle of 1 ms.
  b) The SBPI-induced HV of 5-7V in NMOS Flash cell's channel is isolated from SRAM's paired LV outputs of Q and QB due to the protection of ST1 and ST3. As a result, the SRAM cell would not be damaged during NMOS Flash string's HV program operation. The ST2 and ST4 are shut off to avoid channel leakage to ensure the proper operation of SBPI. All select transistors of ST1, ST2, ST3 and ST4 have to be made of HV device with thicker oxide to sustain the channel punch-through and junction breakdown of VDS of 5-7V boosted by SBPI program scheme in NMOS Flash cell MC's channel region that stresses to both source nodes of ST1 and ST3 and the drain nodes of ST2 and ST4. In order to make a compact Flash string to ensure the success of SBPI, the ST1, ST2, ST3, ST4 and MC1 and MC2 are preferably made within the same P-sub or Triple P-well in prior art of the same inventors to reduce the junction capacitance between MC and ST transistors in the same string.

Figure 1B:
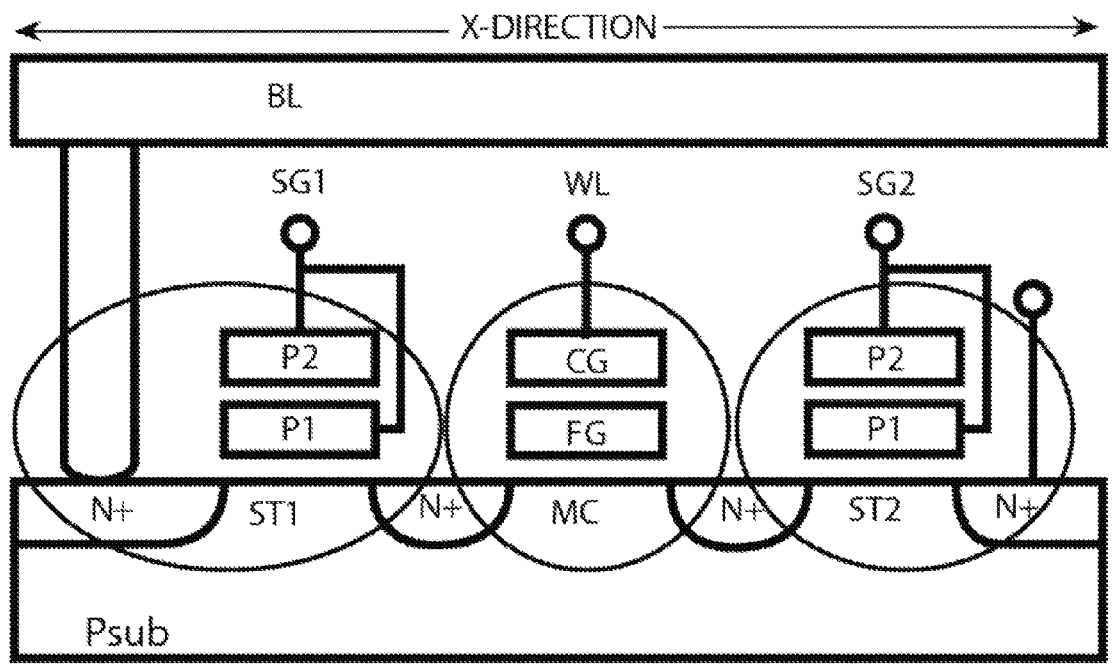
FIG. 1B is a cross-sectional diagram of above 3T NMOS Flash string circuit used in a NMOS NVSRAM cell of prior art.

FIG. 1B is a cross-sectional diagram of the 3 T NMOS Flash string circuit of FIG. 1A used in a NMOS NVSRAM cell of prior art. Presenting this traditional NVSRAM cell circuit is merely used as part of an inventive process as described below. As seen, the two 1-poly HV NMOS Select transistors, ST1 and ST2, and one 2-poly floating-gate type NMOS Flash transistor are all formed on the common P-sub. The top terminal of the Flash string is connected to BL (Metal bitline) and the bottom terminal is connected to SL (source-line). As shown in FIG. 1B, Poly2 gate and Poly1 gate of each of the two ST1 and ST2 transistors are shorted to form a Poly1-gate NMOS Select transistor. As a result, only the MC Flash transistor has the NVM storage capability.

During the SBPI programming scheme, the channel of 2-poly Flash transistors, MCs, will be boosted to a voltage level of +5V to +7V when MC's WL is ramped to a HV of +12V to +18V due to the coupling effect from Common Gate (CG) to Floating Gate (FG) when MC's channel is at floating state initially. The electrical field between Flash channel and Poly1 gate voltage is then reduced to less than 5V providing the coupling ratio from CG to FG is around 70%. As a result, the electrical filed of MC's tunnel oxide between FG and channel is drastically reduced to the required FN tunneling voltage. Thus the FN channel tunneling effect would not happen to the Program-Inhibited Flash cell in one of the non-selected Flash string of paired Flash strings of each NMOS NVSRAM cell (FIG. 1B).

Conversely, the selected Flash cell with its channel is held at VSS when its WL gate is ramped to +18V during the program operation. The effective tunnel oxide electrical filed would exceed 10 mV/cm to induce the desired FN-channel tunneling effect. As a result, the selected Flash cell's Vt would be increased above 2.0V in one of the selected Flash string of the selected paired Flash strings of the selected NMOS NVSRAM cell after the Program operation.

In summary, the reason of using the larger 3T NMOS Flash string is to leverage the benefit of the low Program VSS and Program-Inhibit VDD voltages in NMOS Flash string BL input. In 1T Flash string, the BL voltage for Program-Inhibit voltage needs at least 5.0V or above. In other words, using the 3T NMOS Flash string of FIGS. 1A and 1B has a benefit over using LD VDD and VSS BL voltages for Program-Inhibit and Program voltage but at expense of the larger 3T cell size overhead.

Figure 1C:
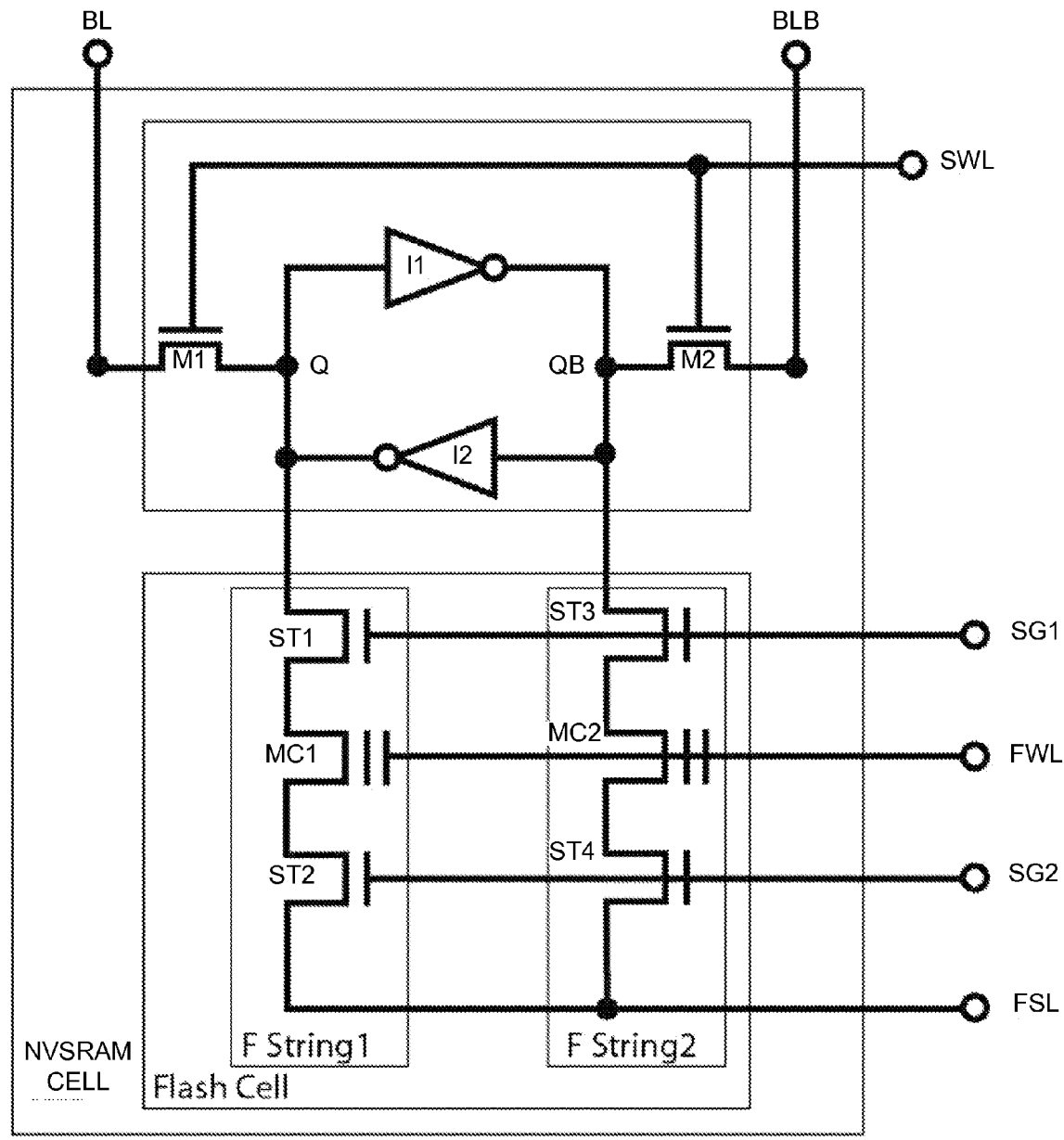
FIG. 1C is a schematic diagram of a 12T NMOS NVSRAM cell of prior art.

FIG. 1C is a schematic diagram of a 12T NMOS NVSRAM cell of prior art. Presenting this traditional NMOS NVSRAM cell circuit is merely used as part of an inventive process as described below. As shown, it comprises one 6T LV CMOS SRAM cell on top and one HV NMOS Flash cell on bottom comprising of two 3T HV NMOS Flash strings, FString1 and FString2, each being shown in FIG. 1B. The Flash transistor type is 2-poly floating-gate NMOS cell.

Dung SRAM's normal Read and Write operations, SG1 is coupled to VSS to completely isolate two NMOS Flash strings of each Flash cell from each SRAM cell. As a result, the SRAM's Read and Write operations would not be disturbed and each Flash cell is transparent to each SRAM cell of each NMOS NVSRAM cell of FIG. 1C.

During each data writing from each 6T SRAM cell into two 3T Flash strings of corresponding 6T Flash cell, the SWL is grounded to isolate SRAM's latch from the global BL and BLB lines. That means the data writing is only performed exclusively between each 6T SRAM cell and each 6T NMOS Flash cell in a local area.

The data writing from 1-bit 6T-SRAM cell into the Flash cell is performed on 2 complementary Flash bits, MC1 and MC2, of two 3T NMOS Flash strings such as FString1 and FString2 of FIG. 1C. In a normal Program operation, only one bit of MC1 and MC2 gets programmed and one bit gets program-inhibited. In the beginning, two Flash cells, MC1 and MC2, are erased to a common Vt0 state first and then one of MC cells is programmed to Vt1 state selectively. After successful Program and Program-Inhibit operations, MC1 and MC2 store the complementary Vt0 and Vt1 states, depending on the SRAM pattern applied to Q and QB nodes. If QB node is at VDD, then MC2 Vt level stays at Vt0. MC1 would be programmed to the Vt1 state because Q voltage is at VSS and vise versa MC2 is programmed to the Vt1 state when QB voltage is at VSS and MC1 stays at Vt0 when Q voltage is at VDD.

FIG. 1D is a table that provides a set of bias conditions for various key NMOS NVSRAM operations including Erase and Program and Program Inhibit of the Flash cell and Read of the SRAM cell of the NMOS NVSAM cell of FIG. 1C. Presenting these traditional NVSRAM operations is merely used as part of an inventive process as described below. Since this NMOS NVSRAM has 2-poly Flash string, thus the disadvantage of Erase and Program operation needs to use much higher FWL voltages of −18V and +18V respectively if the low coupling ratio from Poly2-control gate to Poly1-floating gate is used.

The Vt level of the programmed Flash cell would be Vt1 and is designed to be ≥2V, while the inhibited Flash cell's Vt value would stay unchanged as the initially erased Vt before program. The erased Vt level is Vt0 and is typically set to be ≤−2V. Therefore, in the beginning of Flash Write operation, a FN-channel Erase operation is performed prior to the FN channel Program operation. After FN-channel Erase operation, both Flash cell's Vts are erased to be identical with a targeted value ≤−2V. But after FN channel Program operation, one bit of the selected Flash cell's Vt level would be increased to Vt1 of a value ≥2V. As a result, after FN Program, the Flash cells in the paired Flash strings would store two complementary Vt levels such as +2.0V of Vt1 and −2.0V of Vt0.

For example, as shown in FIGS. 1C and 1D, if the SRAM's Q and QB data are respectively set to be VDD and VSS, then the Flash cell MC1 Vt level would stay with Vt0 of −2.0V, while the other Flash cell MC2's Vt level would be changed to Vt1 of +2.0V. As shown, the polarity of the stored data of MC1 and MC2 of each Flash cell is opposite of the stored data of paired Q and QB of each SRAM cell after a FN channel Program operation. That would lead to wrongly loading of Flash reverse data into each SRAM during the power-up cycle if it is not handled correctly. Even worse, when it comes to 1.2V VDD operation, correct loading of Flash data into SRAM will fail. It is because the correct data loading from Flash cell to SRAM cell requires high VDD-Vt voltage to set the SRAM cell into a right state, where Vt is defined by the largest Vt level of transistors of each F-string. Typically, the Vt levels of ST1 and ST2 of FIG. 1C are the same with a value around 0.7V. But the Vts of MC1 and MC2 of FIG. 1C are set with complementary values of +2.0V and −2.0V.

Therefore, the equivalent Vt level of each FString is 0.7V, which is determined by ST's Vt provided that the MC's Vt level is at Vt0. In contrast, the equivalent Vt level of each FString is 2V, which is determined by the stored Vt1 of the MC cell.

When VDD of 1.8V or higher is used, a current flow from FSL to charge either Q or QB node of the 6 T SRAM cell up to the value of VDD-Vt to set the SRAM cell (see FIG. 1C). If Q node is being charged up, then the Q voltage is set to be VDD and QB is VSS. If the QB node is being charged up, then QB voltage is VDD but Q is VSS.

But when it comes to the operation using 1.2V VDD, the value of VDD-Vt becomes only 0.5V in the worst-case condition from which it is not high enough than the value of NMOS Vt of the 6T SRAM cell. As a result, the data loading from the Flash cell into the corresponding SRAM cell of each NMOS NVSRAM cell of FIG. 1C would fail at low 1.2V VDD operation. Thus, using charge-up approach from FSL to Q or QB of the SRAM cell at 1.2V or below even 1.5V VDD operation is no longer valid. An improvement over for 1.5V fast data loading from the Flash paired strings to each SRAM cell is needed.

Figure 2A:
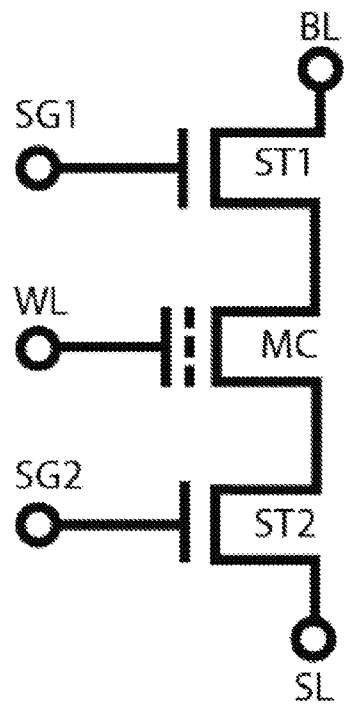
FIG. 2A is another schematic diagram of a 3T NMOS Flash string used in another NMOS NVSRAM cell of prior art.

FIG. 2A is another schematic diagram of a 3T NMOS Flash string used in another NMOS NVSRAM cell of prior art. Further, presenting this traditional 3T NMOS Flash string diagram is merely used as part of an inventive process as described below. As shown, the 1-poly NMOS Flash string consists of two 1-poly HV NMOS Select transistors, ST1 and ST2, and one 1-poly but charge-trapping Flash type, SONOS or MONOS, NMOS Flash transistor, MC. Unlike the Poly1-gate transistors of ST1 and ST2 shown in FIG. 1A, which is formed by shorting the poly2 and poly1, the ST1 and ST2 transistors of the FIG. 2A are the regular single-poly-gate NMOS devices based on single-poly process. The Flash cell of FIG. 2A, MC, is a single-poly charge-trapping SONOS or MONOS NMOS Flash storage transistor. The 3T NMOS 1-poly Flash string has five connection terminals such as BL, SG1, WL, SG2 and SL.

Figure 2B:
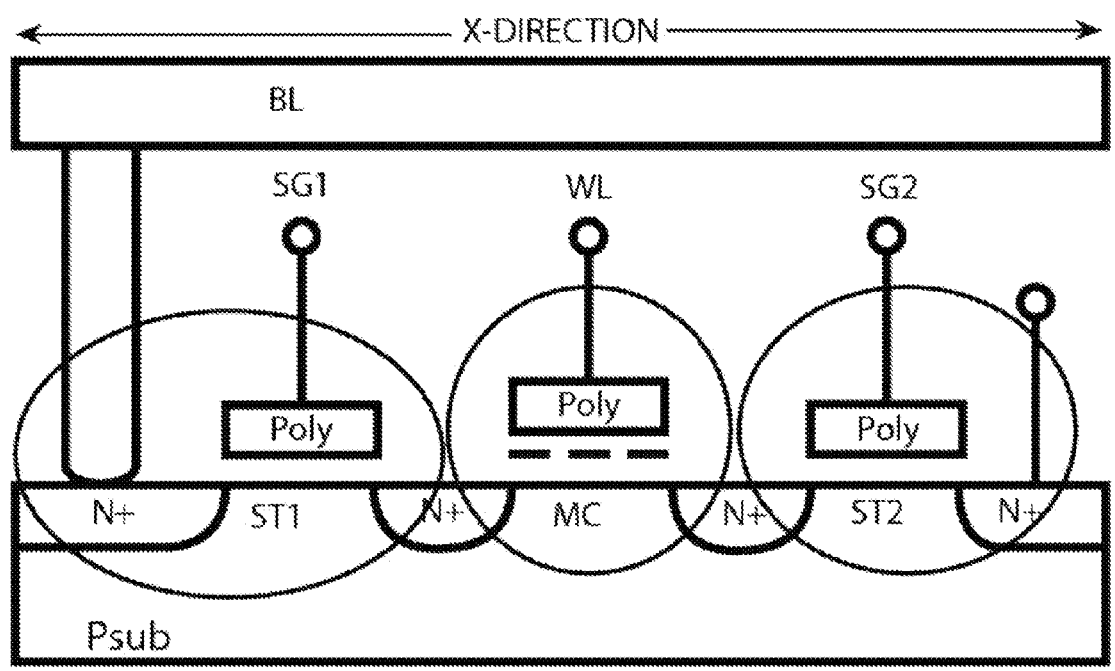
FIG. 2B is a similar cross-sectional diagram of above 3T NMOS Flash string with 1-poly charge-trapping type Flash transistor sandwiched by two 1-poly NMOS Select transistors of prior art.

FIG. 2B shows a cross-sectional diagram of above 3T NMOS Flash string with 1-poly charge-trapping type Flash transistor sandwiched by two 1-poly NMOS Select transistors. Presenting this traditional 3T NMOS Flash string diagram is also merely used as part of an inventive process as described below. As shown, the two regular HV NMOS Select transistors, ST1 and ST2, and one 1-poly charge-trapping-gate type NMOS Flash transistor are all formed on the common P-sub. Similarly, the top terminal of the Flash string is connected to BL (Metal bitline) and the bottom terminal is also connected to SL (sourceline). To form a Flash cell of the PMOS NVSRAM cell, another complementary NMOS Flash string with a separate top terminal BL is added to connect to one of Q and QB nodes of the same 6T SRAM cell, but the SL is shared by the paired Flash strings.

As like FIG. 1B, the reason to use this 3T NMOS 1-poly Flash string of FIG. 2B to replace 1T Flash cell is to leverage the design simplicity of using LV VDD and VSS inputs at the top BL node of the 3T Flash string for respective Program-Inhibit and Program operation in fast low-power Program operation of NMOS NVSRAM cell (see FIG. 2C below).

Figure 2C:
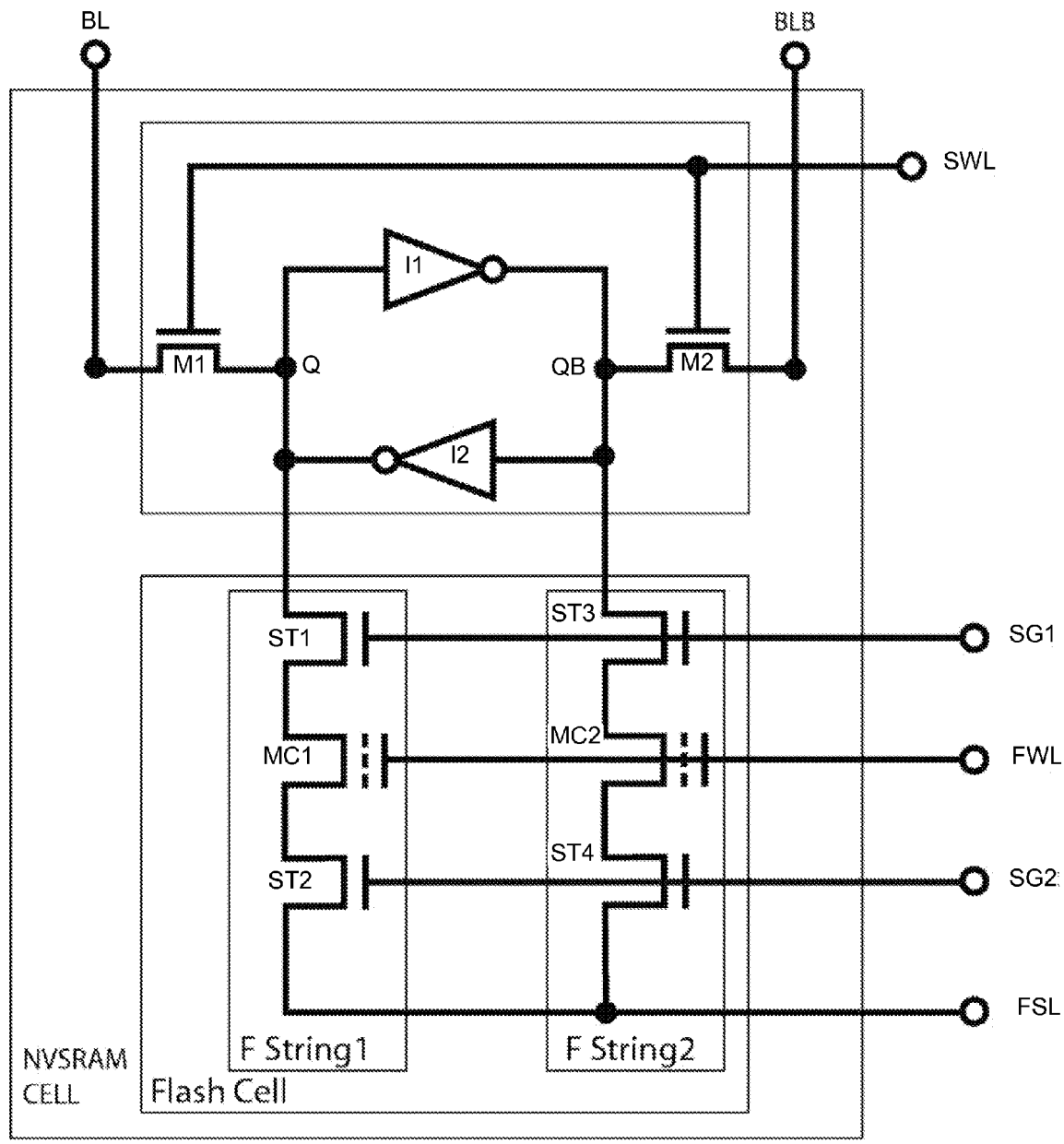
FIG. 2C is a schematic diagram of the second NMOS NVSRAM cell of prior art.

FIG. 2C shows a similar schematic diagram of the second NMOS but 1-poly NVSRAM cell of prior art. Again, presenting this traditional NVSRAM cell diagram is also merely used as part of an inventive process as described below. As shown, the NVSRAM cell also comprises one 6T LV CMOS SRAM cell on top and one HV Flash cell on bottom comprising of two 3T NMOS 1-poly Flash strings as shown in FIG. 2B. The NMOS Flash type is the single-poly charge-trapping SONOS or MONOS cell.

FIG. 2D is a table showing another set of bias conditions for various key operations of the NVSRAM cell shown in FIG. 2C. Presenting these traditional NVSRAM operations is merely used as part of an inventive process as described below. The operations include Erase, Program and Program Inhibit of the Flash cell of the SRAM cell of the 1-poly NVSRAM cell. Since this NVSRAM cell of FIG. 2C comprises two single-poly Flash strings, the advantage of Erase and Program operations of FWL is that it uses much lower gate voltages of +7V and −7V than the ones used in the 2-poly NVSRAM cell as shown in FIG. 1C.

Again, this 1-poly NMOS NVSRAM cell of FIG. 2C has a similar issue of reverse data polarity writing between the 6T SRAM and two 3T Flash strings as the prior art of 2-poly NMOS NVSRAM cell shown in FIG. 1C.

In addition, when it comes to a low VDD operation below 1.5V or even below 1.2V, the similar charge-up voltage of VDD-Vt becomes only 0.5V in the worst-case condition in which it is not high enough comparing to the Vt value of the 6T SRAM cell. As a result, the similar Data Loading from the Flash cells, MC1 and MC2, into the corresponding SRAM cell of each NVSRAM cell of FIG. 2C would fail at the low 1.2V VDD operation. Thus, using the similar charge-up approach from FSL of both Flash strings to Q or QB nodes of the SRAM cell at the low VDD operation with VDD below 1.5V or 1.2V is no longer valid for this SONOS-type NMOS NVSRAM cell of FIG. 2C. An improvement for 1.5V below or 1.2V VDD operation is needed. For the detailed operation, please refer to the description of the prior art cited earlier.

Figure 3A:
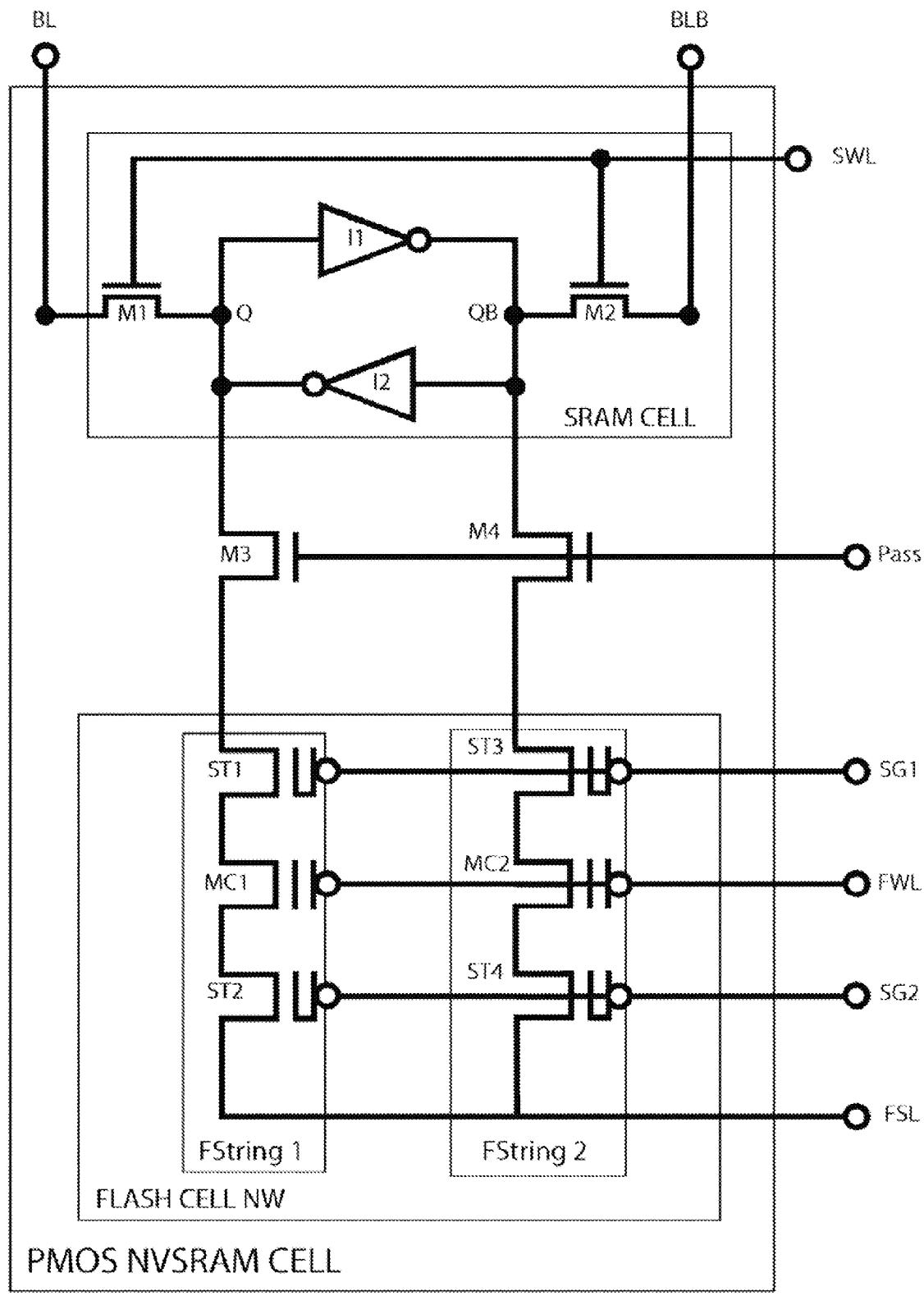
FIG. 3A is a schematic diagram of an embodiment of a 14T PMOS NVSRAM cell according to an embodiment of the present invention.

FIG. 3A is a schematic diagram of a 14T PMOS NVSRAM cell according to an embodiment of the present invention. This diagram is merely an example, which should not unduly limit the scope of the claims herein. One of ordinary skill in the art would recognize other variations, modifications, and alternatives. As shown, each PMOS NVSRAM cell includes one 6T LV SRAM cell coupled to one 6T HV PMOS Flash cell through two strings respectively by two LV NMOS transistors having gates commonly tied to a Pass signal. The 6T LV SRAM cell has a standard structure made by two LV PMOS transistors and four LV NMOS transistors. A first NMOS transistor and a second NMOS transistor share a common word line (SWL). The first NMOS transistor connects a bit line BL to a first data node Q, the second NMOS transistor connects a complementary bit line BLB to a second data node QB. The first data node Q and the second data node QB are coupled respectively to two cross-coupled invertors I1 and I2 (made by four LV CMOS transistors).

The 6T PMOS Flash cell has two 3T PMOS Flash strings. Each 3T PMOS Flash string circuit comprises three (3) HV PMOS transistors: 1-poly Select transistor, ST1, 2-poly Flash transistor, MC1, and 1-poly Select transistor, ST2, for the left Flash string, FString1; and 1-poly Select transistor, ST3, 2-poly Flash transistor, MC2, and 1-poly Select transistor, ST4, for the right Flash string FString2. The gates of ST1 and ST3 are commonly tied to a SG1 signal. Similarly, the gates of 1-poly ST2 and ST4 are common tied to a SG2 signal. Finally, the common poly2-gate of 2-poly PMOS Flash transistors, MC1 and MC2, of the two 3T PMOS Flash strings are tied to a FWL signal, which is referred as the Flash Word Line. The paired inputs of FString1 and FString2 of the 6T Flash cell are connected to paired data nodes, Q and QB, of the 6T SRAM cell.

FIG. 3B is a table providing a preferred set of bias conditions for various PMOS NVSRAM operations according to an embodiment of the present invention. All the operations include Erase, Program and Program-Inhibit of the Flash cell, Read of the SRAM cell, Data Loading from the Flash cell to the SRAM cell during power-up cycle of the PMOS NVSRAM cell. This diagram is merely an example, which should not unduly limit the scope of the claims herein. One of ordinary skill in the art would recognize other variations, modifications, and alternatives. Although this NVSRAM cell is composed of two similar 2-poly floating-gate PMOS Flash strings, the preferred Writing voltage of Erase/Program operation can be drastically reduced from high voltage value of +18V/−18V used in prior art of FIG. 1C to much lower voltage value of +12V/−12V for a safer and quicker PMOS NVSRAM operation. This is accomplished by increasing the Flash cell's coupling ratio from poly2-control-gate to poly1-floating-gate by extending more poly1 material out from gate area of the Flash cell in its layout.

Figure 3C:
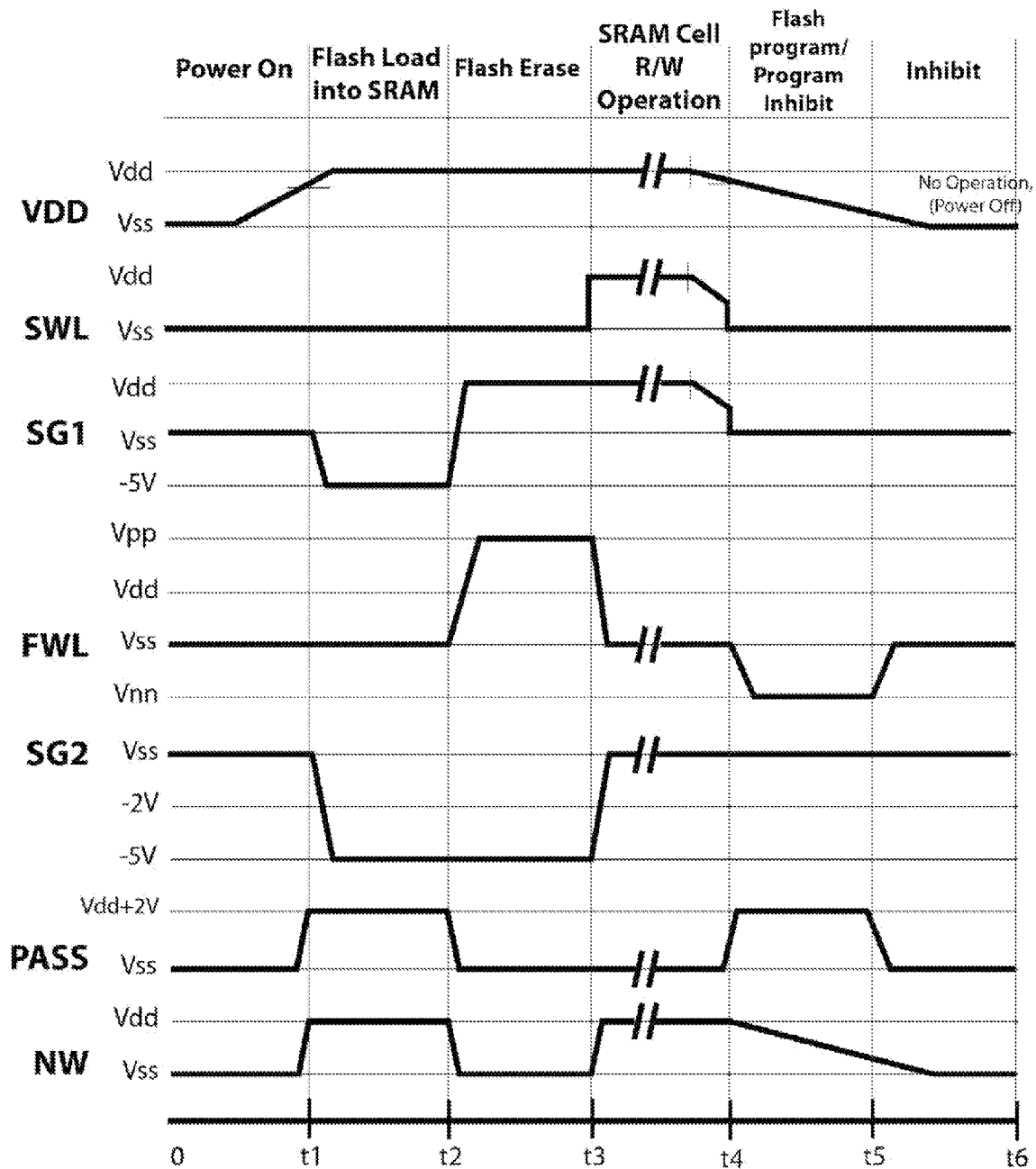
FIG. 3C shows a timeline for operating the 3T PMOS Flash-string of a 2-poly PMOS NVSRAM cell according to an embodiment of the present invention.

FIG. 3C is a diagram showing a timeline for operating the 3T PMOS Flash string of a 2-poly PMOS NVSRAM cell according to an embodiment of the present invention. This diagram is merely an example, which should not unduly limit the scope of the claims herein. One of ordinary skill in the art would recognize other variations, modifications, and alternatives. VNN stands for a negative high voltage (HV) of −12V or lower voltage required for a FN-channel Program scheme for FWL. VPP stands for a positive HV of +12V or higher voltage required for a FN-channel Erase scheme. In reality, VPP voltage level can be chosen from any value within +18V and +12V and VNN voltage level can be selected from a value between −18V and −12V.

The details of operation between each of the paired 3T PMOS Flash strings and corresponding SRAM cell will be explained in accordance with the preferred set of bias conditions shown in FIG. 3B and the timeline control shown in FIG. 3C below.

The definitions of signal names shown in FIGS. 3A-3C and further in other memory cell diagrams are explained below.
a) BL: Bitline of 6T SRAM
b) BLB: Complementary BL of 6T SRAM
c) Q and QB: The paired output nodes of each 6T SRAM cell
d) SWL: 6T SRAM's common wordline in the same row
e) SG1: The first control signal of top HV PMOS 1-poly poly1 Select transistors' common gate, ST1 and ST3, of the paired 3 T FString1 and FString2
f) SG2: The second control signal of bottom HV PMOS 1-poly poly1 Select transistors' common gate, ST2 and ST4, of the paired 3 T FString1 and FString2
g) FWL: 2-poly PMOS Flash cells' common gate, MC1 and MC2, connected Flash WL in same row
h) FSL: 2-poly PMOS Flash string's common sourceline There are several major differences of the preferred bias conditions shown in the table of FIG. 3B comparing to prior art tables of FIG. 2D and FIG. 1D. The detailed description of the preferred bias conditions and Flash cell's Vt assignments between the table of FIG. 3B of the PMOS NVSRAM cell of the present invention and the tables of FIG. 2D and FIG. 1D of the NMOS NVSRAM cell of prior art will be explained below.

In an embodiment, the Flash transistor threshold voltage Vt assignment is defined identical between PMOS Flash cell and NMOS Flash cell, regardless of 1-poly or 2-poly Flash transistors. In NMOS Flash cell, the programmed transistor Vt is defined as a positive value of Vt1, which is non-conduction off-state with a desired value of around +2.0V. On the contrary, the erased Vt state of NMOS Flash transistor is defined as Vt0, which is a conduction state typically with a desired value of −2.0V or lower. In the PMOS Flash cell two Vt assignments are the same as the NMOS Flash cell. The Vt1 of 2.0V is preferably defined as the program state, which is non-conducting, while Vt0 of −2.0V is defined as the erase state in the conduction state.

The difference is that the way of electrons being stored in the floating-gate of the Flash cell makes Vt polarity opposite. In the PMOS Flash cell, the injection of electrons into its floating-gate makes it into a conducting state. By contrast, in the NMOS Flash cell, the injection of electrons into its floating-gate makes it into a non-conduction state.

In another embodiment, both Erase and Program operations are using similar low-current channel FN tunneling scheme, regardless of PMOS Flash cell or NMOS Flash cell. As a result, large density Program and Erase operations of the Flash cell array can be performed simultaneously with a faster speed.

Furthermore, as oppose to the approaches of two NMOS NVSRAM prior art, FSL voltage is applied at VDD level to allow a current flow to charge Q or QB nodes of the SRAM cell from the Flash string that stores Vt0 to set SRAM data due to the reverse data polarity between the SRAM and the Flash strings. Instead of relying on the charging up one of Q and QB nodes to set the right SRAM data from the Flash cell, the FSL voltage is preferably held at VSS level upon the power-up cycle so that one of the Q or QB nodes will be discharged to the VSS level through the Flash string that stores Vt0 at a low-VDD operation. This can only be done perfectly when the polarities of the stored data between SRAM and Flash strings are kept the same.

In the PMOS NVSRAM cell according to an embodiment of the present invention, the data polarity in 6T PMOS Flash cell is kept the same as the 6T SRAM cell, therefore FSL can be held at ground level (VSS) for low 1.5V VDD operation for easier circuit design and superior performance to load Flash data into the SRAM cell or allow the SRAM cell's data to be written into the Flash cell.

Referring to FIG. 3B, all the key operations of the 2-poly PMOS NVSRAM provided in an embodiment of the present invention will be explained below.

Flash Erase operation: In this operation, the Erase operation uses a FN-channel Erase scheme. This Flash Erase operation is unrelated to SRAM. During each Flash cell's Erase operation, each SRAM cell's paired Q and QB nodes have to be isolated from two Flash strings by shutting off ST1 and ST3 PMOS devices. This can be done by coupling SG1 to VDD because ST1 and ST3 are PMOS HV devices. The Erase bias conditions and the preferable targeted specs are summarized below:

a) Flash gate voltage, FWL, is set to be a HV positive value, VPP, ranging from +12V to +18V, depending on the PMOS Flash cell's coupling ratio from control gate CG to floating gate FG;
b) Lower VPP value is better for smaller pump area and safer Program and Erase operation;
c) Flash drain voltage=Flash channel voltage=Flash source voltage=NW ($N_{Well}$)=VSS. The field drop between FWL and Flash channel $\Delta V$=VPP−VSS. Thus the gate voltage VPP may be reduced for power saving without affecting Erase speed during the Erase operation via FN-channel Erase scheme;
d) Erase time ≤10 ms for storage density ≥200 Mb;
e) Erase verification: No need by using one long pulse;
f) Erased Vt=Vt0≤−2V.
g) Pass-control signal for M3 and M4 is set to VSS, to shut off the connection between the SRAM cell and the Flash cell.

After the Erase operation, two 2-poly Flash cells' Vt values in two Flash strings would become an identical value of Vt0≤−2V.

Flash Program (Write) operation from SRAM: Similarly, the Program operation also uses FN-channel scheme. The Program biased conditions and the preferable targeted specs are summarized below:

a) Common Flash gate voltage, FWL, is set to a HV negative value, VNN, ranging from −12V to −18V;
b) The Flash string associated with a SRAM data node (Q or QB) at VDD: Flash drain voltage=Flash channel voltage=NW ($N_{Well}$)=VDD. As a result, the field drop $\Delta V$=VNN+VDD>10V between FWL and Flash channel. The FN tunneling effect would occur;
c) Program verification: No need by using one long pulse. Programmed Vt=Vt1≥+2V;
d) Pass-control signal for M3 and M4 is set to VDD+2V (margin), to open up the connection between the SRAM cell and the Flash cell.

Flash Program-Inhibit operation from SRAM:
a) Flash gate voltage, FWL, is set to a HV negative value, VNN, ranging from −12V to −18V;
b) Q or QB is set to be VDD for the Program condition;
c) QB or Q is set to be VSS for the Program-Inhibit bias condition;
d) SG1 is coupled to VSS. SG1 allows ST1 and ST3 (provided that two Pass-control transistors are in conduction state) to connect Q and QB nodes of SRAM with the Flash cell channel. If Q or QB is at VDD, then it would be fully coupled to Flash channel without any field drop (see above for the Program operation). But if Q and QB is at VSS, then it would float the PMOS Flash channel as both drain and source terminal is at VSS since SG2 is applied to VSS and FSL is coupled at VSS, too;
e) The Flash string associated with a SRAM data node (Q or QB) at VSS: Flash drain voltage=Flash source voltage=−5V by coupling from the Flash gate voltage FWL (at VNN) when the Flash channel in a floating state initially with $N_{Well}$=VDD;
f) Field drop $\Delta V$=VNN+5V≤10V between FWL and Flash channel. As a result, the FN tunneling effect would be prohibited;
g) The Flash transistor Vt level stays with Vt0 without change after FN channel Program;
h) The writing from the SRAM cell to the Flash string is under a sudden power-lose period. It is done within a short period of time such as 10 ms. This is most challenging for NVSRAM design;
i) Pass-control signal for M3 and M4 is set to VDD+2V, to open up the connection between the SRAM cell and the Flash cell.

PMOS Flash Data Loading into SRAM:
a) The two PMOS select gates are turned on by coupling both SG1 and SG2 with 0V. For less resistance, SG1 and SG2 can be coupled to a more negative voltage value down to −5V as seen in the table of FIG. 3B;
b) The PMOS Flash cell is turned on or off by coupling the common gate of FWL to VSS, depending on threshold voltage level. If a Flash transistor having Vt0 level in one string is turned on and the Flash transistor having Vt1 level in the complementary string will be turned off;
c) The SRAM cell is isolated from BL and BLB by coupling SWL to 0V to turn off M1 and M2;
d) If the Flash transistor MC1 Vt level is at Vt0≤−2V and the Flash transistor MC2 Vt level is at Vt1≥+2V, then Q node of the SRAM cell would be set to 0V and QB node would be set to VDD, and vice versa;
e) The writing from PMOS Flash strings to SRAM is during the power-up period. The power-up has lasted a time span longer than few milliseconds to write Flash data to the SRAM cell. It is not the big concern of the NVSRAM operation;
f) Pass-control signal for M3 and M4 is set to VDD+2V, to open up the connection between the SRAM cell and the Flash cell.

SRAM normal Read and Write operations:
a) The PMOS Flash strings are isolated from the SRAM cell by coupling the top Select gate SG1 to VDD. Other Flash control signals are in "X" state. "X" means "don't-care;"
b) SWL is turned on by connecting to VDD when the SRAM cell is selected. Under normal SRAM operation, the Flash string is out from the circuit;
c) Pass-control signal for M3 and M4 is set to VSS, to shut off the connection between the SRAM cell and the Flash cell.

The table in FIG. 3B contains one set of detailed bias conditions of above said key operations for the PMOS NVSRAM cell according to an embodiment of the present invention. Each operation is designed to be totally independent from the other operation. Only FWL has four voltages levels such as VPP, VDD, VSS and VNN. The rest of the signals only have two voltages levels of VDD and VSS. Since only FWL requires VPP during the FN channel Program operation, the charge time is quick because no P/N junction is involved. Thus an easier circuit control and smaller +/−HV charge pump circuits can be built in an on-chip manner for fast Program and Erase operation within 10 ms for NVSRAM density as high as 200M bits.

Referring to FIG. 3C, the preferred timeline for various key operations of the 2-poly NVSRAM cell according to an embodiment of the present invention is illustrated in a single diagram. Although the time shows t1, t2, t3, t4, t5 and t6 in X-axis, it is not intended to show a real timing sequence. It just shows each operation with a preferred bias condition for the related signals of the 6T SRAM and two 3T PMOS FStrings of the present invention.

Period 0 to t1 is defined as a VDD power-on period of operating this PMOS NVSRAM cell and array. Within this period, the VDD power line is being ramped from the initial VSS voltage to the final VDD voltage level. During this period all on-chip signals, such as SWL, SG1, FWL, SG2, Pass and NW are started from the VSS level.

When VDD ramps up to hit a VDD power-on detecting voltage level, then the PMOS NVSRAM cell is preparing to load the data stored in every pair of PMOS Flash strings into its corresponding SRAM cell on the same time. The VDD detecting level can be 70% of the designed VDD level. For example, if the VDD is 1.8V, then the on-chip detecting voltage can be set around 1.56V. Once detected, a power-on pulse is generated to trigger many on-chip built-in operations. One key operation is to load the stored data from each NVM PMOS Flash cell into each VM SRAM cell.

Period t1 to t2 is defined as a period for automatic Data Loading from the PMOS Flash cell into the SRAM cell. The biased conditions of all key control signals are in accordance with the cell circuit in FIG. 3A and bias table in FIG. 3B.

In order to load data from the PMOS Flash cells to the SRAM cell, the PMOS select-gate transistors (ST1, ST2, ST3, and ST4) are turned on by coupling both select gates SG1 and SG2 to the VSS level or lower (in an embodiment, −5V is applied), along with coupling two LV NMOS transistors M3 and M4 in a conduction state by coupling their common gate Pass to at least the VDD level or higher (in an embodiment, VDD+2V margin is applied). The common gate of PMOS Flash transistors, MC1 and MC2, are coupled to the VSS level to turn on the pair of PMOS Flash transistors. The one stored at Vt0 level will be in a conduction state and the other stored at Vt1 level will be in a non-conduction state. As a result, the right and same polarity of the PMOS Flash data would be set to the SRAM cell.

For example, if the Flash transistor MC1 stores Vt0 and the other Flash transistor MC2 stores Vt1, then Q node of the SRAM cell would be pulled down to the VSS level and the QB node would be pulled up to the VDD level after the power-on period. On the contrary, if MC1 stores Vt1 and MC2 stores Vt0, then QB node of the SRAM cell would be pulled down to the VSS level and Q node would be pulled up to the VDD level after the power-on period. The stored PMOS Flash data matches the SRAM data polarity. In other words, low Vt0 level in the Flash transistor MC1 would set Q node to be at the VSS level. High Vt1 level in the Flash transistor MC2 would set QB node to be at the VDD level. But in NMOS NVSRAM or prior art, the stored NMOS Flash data Vt polarity is opposite to the corresponding SRAM data voltage polarity stored in Q and QB nodes.

Note, during the Data Loading from the Flash cell to the SRAM cell, an on-chip negative charge pump is preferably enabled to provide a negative voltage of about −5V for both select-gates SG1 and SG2 for superior data loading with a safer margin in low VDD (<1.5V) operation.

Referring again to FIG. 3C, a period from t2 to t3 is defined as a Flash Erase period. After the successful Flash data loading into the SRAM cell, then the selected PMOS Flash cells can be erased to have its Vt state being pulled down to the Vt0 state to prepare for the data writing from the SRAM cell to the PMOS Flash cell once a sudden loss of VDD power is detected. Some protected PMOS Flash cells of the NVSRAM cells can be excluded from the Flash Erase operation.

In order to instantly write the SRAM data into the PMOS Flash cell, the connection between the SRAM cell and the Flash cell has to be enabled but each SRAM cell has to be isolated from the global BL and BLB by grounding SWL, as seen in the diagram with the period from t2 to t3. Firstly, the top Select transistors ST1 and ST3 will be turned off by coupling SG1 to VDD level. Additionally, as the common N-well region is set to be VSS level, to avoid possible leakage of current from the SRAM cell into the N-well, a pair of Pass transistors, e.g., each being a LV NMOS transistor, can be disposed respectively in series between the Q and QB nodes and the ST1 and ST3 for providing an desired isolation by applying a common Pass control signal to shut off the connection between the SRAM cell and each Flash string during the Erase period.

Only in this Erase operation, both PMOS Flash cells, MC1 and MC2, are coupled to a HV positive voltage VPP, ranging from +12V to +18V, to cause a desired FN-tunneling effect for pulling down the Vt state of the Flash transistor from Vt1 state to Vt0 state. As the result, data in both Flash transistors are erased simultaneously to an identical Vt0 state, other than a complementary Vt0 and Vt1 as done in Flash Program operation to be mentioned later, because both PMOS Flash cells have the same FWL voltage VPP and same channel voltage from FSL at VSS. The erase time is preferably done within 10 ms if the NVSRAM density is very high.

Period from t3 to t4 period is defined as a Read and Write cycle of the SRAM cell itself. In this period, all Flash strings have to be isolated from the SRAM operation. This can be done by shutting off two top PMOS Select transistors ST1 and ST3 by keeping SG1 coupled to a VDD level along with coupling SG2 to a VSS level to turn on both bottom PMOS Select transistors ST3 and ST4 while the common Flash Source Line FSL is also set to the VSS level.

Since this is like the regular SRAM Read and Write operations, thus the SRAM word line SWL couples to the VDD level to turn on connection of Q and QB nodes respectively to the global BL and BLB. The FWL voltage becomes a 'don't care' state but is preferably being set to the VSS level.

From t4 to t5 the period is defined as a power-down period, which can be induced either by a desired regular power-down event or an undesired unexpected VDD power-loss event. As an on-chip power-down detecting circuit is enabled all the time, once the power voltage drops (from VDD) to below the set 70% of the VDD level, a power-down pulse is generated on chip to initialize an instant writing operation from each VM SRAM cell to each paired NVM PMOS Flash cells of this PMOS NVSRAM cell array in accordance with the biased condition set in the table in FIG. 3B.

In order to write SRAM data into the paired Flash transistors with the same polarity, the SWL is coupled to the VSS level to isolate the SRAM cell from global BL and BLB. In addition, SG1 can be coupled to the VSS level to open connections of the top select-gate PMOS transistors ST1 and ST3 respectively to the Q and QB nodes of the SRAM cell. The Flash cell's common N-well region is set at the VDD level at the time of the power-loss event and is changing to the VSS level after writing VM SRAM data into the NVM Flash cell. The FWL is preferably coupled to a HV negative voltage, VNN, ranging from −12 V to −18V, to result in a FN-tunneling effect for programming data into the PMOS Flash transistor. Additionally, SG2 remains at the VSS level to open up the bottom select-gate PMOS transistors ST3 and ST4 from connection to FSL which is also set to the VSS level. Any data node, Q or QB, of the SRAM cell at the VDD level would be passed to the corresponding Flash channel through a PMOS Flash Program operation. By contrast, any data node, Q or QB, of the SRAM cell at the VSS level would be blocked, which make the Flash channel in a floating state through a PMOS Flash Program-Inhibit operation, provided that SBPI scheme is used during both the Flash Program and the Program-Inhibit operations.

After the successful Flash Program operation, the same polarity of the SRAM data would be instantly written into the paired Flash strings of the PMOS NVSRAM cell provided in this invention. Note, the NW node (the N-well region) bias voltage of the Flash cell tracks variation of the power voltage VDD. Therefore once the power voltage VDD level is dropping, the NW bias voltage will track it accordingly as seen in the NW graph (shown in FIG. 3C). In a period from t5 to t6, the whole chip's power is dropped to the VSS level, therefore all operations would be stopped.

Referring to FIG. 3A, in an alternative embodiment the two LV NMOS transistors, M3 and M4, can be changed to two LV PMOS transistors. In a specific embodiment, the LV PMOS transistors M3 and M4 are made in a N-Well separate from that of the two HV PMOS Flash strings consisting of ST1, MC1, and ST3, ST2, MC2 and ST4 PMOS transistors. It is because the N-Well of the two HV PMOS Flash strings needs to be biased at the VDD and VSS levels respectively during Program and Erase operation. Otherwise the P+ type source nodes and drain nodes would forward a high voltage into the N-Well region to cause short to the PMOS transistors. But for the LV PMOS transistors M3 and M4, its N-Well region can be always biased to the VDD level. The gate voltages of LV PMOS transistors M3 and M4 can be coupled to either a VSS level or a negative voltage for Pass-control during the Flash Program and Erase operations. The detailed description is skipped here for simplicity.

Note that other modifications maybe made but should be considered to be covered by this invention as long as a PMOS SBPI method is used.

In a specific embodiment, the present invention provides a 14 T PMOS NVSRAM memory cell circuit with low-voltage (LV) fast-write scheme. The 14 T PMOS NVSRAM memory cell includes a SRAM cell, a Flash cell, and two LV Pass transistors coupling between the SRAM cell and the Flash cell. The SRAM cell is substantially illustrated in the top portion of the FIG. 3A. The SRAM cell includes a first access transistor M1 and a second access transistor M2 sharing a first word line SWL connected to their common gates and respectively coupling between a first bit line BL and a first data node Q and between a second bit line BLB and a second data node QB. M1 and M2 are two LV NMOS transistors. The first data node Q and the second data node QB respectively are coupled to two cross-coupled inverters I1 and I2 made by four LV CMOS transistors (two LV NMOS transistors and two LV PMOS transistors).

The Flash cell is substantially illustrated in the bottom portion of the FIG. 3A. The Flash cell includes a first Flash string FString1 and a second Flash string FString2 sharing a common N-well region (NW). Each string contains three HV PMOS transistors connected in series. Specifically, FString1/FString2 includes a first/second top Select transistor ST1/ST3, a first/second Flash transistor MC1/MC2, and a first/second bottom Select transistor ST2/ST4 connected in series. In a specific embodiment, the first/second Flash transistor is a 2-poly floating-gate type PMOS transistor. In another specific embodiment, each Select transistor ST1, ST2, ST3, or ST4 is a 1-poly floating-gate HV PMOS transistor capable of protecting the high-voltage of 7V and above across drain and source of the PMOS Flash transistor from affecting the SRAM cell. Referring to FIG. 3A, the two Select transistors ST1 and ST3 are gated commonly by a first select-gate control line SG1 and respectively associated with a first drain terminal and a second drain terminal. The two bottom Select transistors ST2 and ST4 are gated commonly by a second select-gate control line SG2 and respectively associated with a first source terminal and a second source terminal. The first and the second Flash transistors MC1 and MC2 are gated commonly by a second word line FWL. The first source terminal and the second source terminal are connected together to a flash source line FSL.

The pair of Pass transistors M3 and M4 are disposed in the middle portion of the FIG. 3A for connecting the SRAM cell to the Flash cell. In an embodiment, each Pass transistor is a LV NMOS transistor. In particular, transistor M3 and M4 for directly connecting the first data node Q and the second data node QB of the SRAM cell respectively to the first drain terminal and the second drain terminal of the Flash cell. The two LV NMOS transistors M3 and M4 are commonly gated by a pass-control line, Pass, to provide two direct routes of writing data of the SRAM cell via a FN-tunneling effect respectively from the first data node Q and the second data node QB collectively to the first Flash transistor MC1 and the second Flash transistor MC2 of the Flash cell in two complementary threshold voltage states without reversing data polarity by setting a negative high voltage VNN ranging from about −12V to about −18V to the second word line with the common N-well region being set to the VDD voltage. In an alternative embodiment, the two Pass transistors can be LV PMOS transistors. But they should have a common N-well region that is separate from the common N-well region of the Flash cell.

Additionally, other key cell operations include a data-loading operation of writing Flash data to the SRAM cell, especially during a period following a power-on period in the PMOS NVSRAM cell operation timeline, as depicted in FIG. 3C. Further, a cell operation is Flash erase operation, after the Flash data is written into the SRAM cell, is executed to pull-down each Flash transistor's channel threshold voltage state to a low Vt0≤−2.0 V (corresponding to "0" state). Referring to FIG. 3C, other key cell operations further include a normal SRAM cell read/write operation, during the period for the Flash erase operation and the SRAM read/write operation, the Flash cell and the SRAM cell are substantially isolated from each other by setting the SG1 to VDD level to shut off the top Select transistor and setting the Pass to VSS to make each of the two Pass transistors a non-conduction path. Moreover, a key cell operation associated with the 14 T PMOS NVSRAM memory cell is Flash program/program-inhibit operation for writing volatile memory SRAM data to non-volatile memory Flash data by setting high negative voltage to FWL via FN-tunneling effect and floating-gate coupling effect. The first data node Q and the second data node QB either store VDD will be directly passed to a corresponding Flash transistor to set its threshold state at Vt1≥2.0 V. The first data node Q and the second data node QB either store VSS (0V) will be blocked to keep the corresponding Flash transistor's threshold voltage state at Vt0≤−2.0 V.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A 14T PMOS NVSRAM memory cell circuit with low-voltage (LV) fast-write scheme, the 14T PMOS NVSRAM memory cell comprising:
 a SRAM cell comprising six LV CMOS transistors operated at a VDD voltage as low as 1.2 V, the six LV CMOS transistors including a pair of LV NMOS transistors sharing a first word line and respectively coupling between a first bit line and a first data node and between a second bit line and a second data node, the first data node and the second data node respectively being coupled to two cross-coupled invertors made by another two LV NMOS transistors and two LV PMOS transistors;
 a Flash cell comprising a first Flash string of three PMOS transistors and a second Flash string of three PMOS transistors sharing a common N-well region, the first/second Flash string including a first/second top Select transistor, a first/second Flash transistor, and a first/second bottom Select transistor connected in series, the first and the second top Select transistors being gated commonly by a first select-gate control line and respectively associated with a first drain terminal and a second drain terminal, the first and the second bottom Select transistors being gated commonly by a second select-gate control line and respectively associated with a first source terminal and a second source terminal, the first and the second Flash transistors being gated commonly by a second word line for controlling two complementary charge states, the first source terminal and the second source terminal being connected together to a flash source line, and the first drain terminal and the second drain terminal being respectively connected to the first data node and the second data node; and
 a pair of Pass transistors respectively disposed to set up a connection in series between the first data node and the first drain terminal and a separate connection in series between the second data node in series and the second drain terminal;
 wherein the pair of Pass transistors are commonly gated by a pass-control line to provide two direct routes of writing data of the SRAM cell via a FN-tunneling effect respectively from the first data node and the second data node collectively to the first Flash transistor and the second Flash transistor of the Flash cell in two complementary threshold voltage states without reversing data polarity by setting a negative high voltage VNN ranging from about −12V to about −18V to the second word line with the common N-well region being set to the VDD voltage.

2. The 14T PMOS NVSRAM memory cell of claim 1 wherein each of the first and second Flash transistors is a 2-poly floating-gate type HV PMOS transistor including a Poly1 floating gate and a Poly2 control gate over the Poly1 floating gate.

3. The 14T PMOS NVSRAM memory cell of claim 2 wherein each of the first and second top/bottom Select transistors is an 1-poly HV PMOS transistor formed by shorting the Poly2 control gate to the Poly1 floating gate of a 2-poly HV PMOS transistor.

4. The 14T PMOS NVSRAM memory cell of claim 1 wherein each of the first Flash string and the second Flash string comprises an equivalent pull-down resistance of the three PMOS transistors that is lower than the PMOS pull-up resistance of the corresponding SRAM cell for improving data-loading speed from the Flash cell to the SRAM cell during a power-on period to ramp an operation voltage from 0 V to the VDD voltage.

5. The 14T PMOS NVSRAM memory cell of claim 1 wherein the Flash cell is subjected to an Erase operation by setting the second word line to a positive voltage ranging from 12V to 18V to achieve a FN-tunneling effect on each of the two 2-poly floating-gate type HV PMOS transistors along with applying the VDD voltage to the first select-gate control line, grounding the common N-well region, applying 0V to the flash source line, and applying a negative voltage of about −5V to the second select-gate control line.

6. The 14T PMOS NVSRAM memory cell of claim 5 wherein the pass-control line is set at 0 V for isolating the SRAM cell from each Flash string of the Flash cell during the Erase operation if each of the pair of Pass transistors is a LV NMOS transistor.

7. The 14T PMOS NVSRAM memory cell of claim 5 wherein both the first Flash transistor and the second Flash transistor of the Flash cell are associated with an identical threshold voltage level of no greater than −2.0 V in less than 10 ms after the Erase operation.

8. The 14T PMOS NVSRAM memory cell of claim 1 wherein the Flash cell is subjected to Program and Program-Inhibit operations by setting the second word line to the VNN voltage to achieve a FN-tunneling effect on each of the first and second Flash transistors along with applying 0 V to the first select-gate control line, the flash source line, and the second select-gate control line, setting the common N-well region to the VDD voltage, and coupling the pass-control line to the VDD voltage plus about 2V margin to open up the connection between the SRAM cell and the Flash cell if each of the pair of Pass transistors is a LV NMOS transistor.

9. The 14T PMOS NVSRAM memory cell of claim 8 wherein any one of the first data node and the second data node of the SRAM cell charged at the VDD voltage corresponding to part of SRAM data is in a conduction state to connect with one of the first Flash transistor and the second transistor enabled by the FN-tunneling effect to change a threshold voltage level from about −2.0V or smaller to about +2.0 V or greater to be associated with Flash data in less than 10 ms for memory density greater than 200 Mb.

10. The 14T PMOS NVSRAM memory cell of claim 8 wherein any one of the first data node and the second data node of the SRAM cell set at 0 V corresponding to part of SRAM data is in a non-conduction state as the FN-tunneling effect is not enabled, thereby keeping the corresponding one of the first Flash transistor and the second transistor with a threshold voltage level at about −2.0V or smaller to be associated with Flash data.

11. The 14T PMOS NVSRAM memory cell of claim 8 wherein the Program and Program-Inhibit operations are initiated once power voltage of the SRAM cell drops to below 70% of the VDD voltage during a regular power-down event or an unexpected power-loss event to write data from the SRAM cell to the Flash cell in less than 10 ms.

12. The 14T PMOS NVSRAM memory cell of claim 1 wherein the SRAM cell is subjected to a Read/Write operation therein by setting the first word line to the VDD voltage to allow access of the first data node and the second data node respectively by the first bit line and the second bit line, the Read/Write operation being isolated from the Flash cell by coupling the pass-control signal line to 0V and coupling the first select-gate control line to the VDD voltage.

13. The 14T PMOS NVSRAM memory cell of claim 1 wherein the SRAM cell is subjected to a data-loading operation from the Flash cell during a power-up period by setting the first word line to 0 V to isolate two LV NMOS transistors from access of the first bit line and the second bit line, coupling both the first select-gate control line and the second select-gate control line to a negative voltage of about −5 V to open up top/bottom Select transistors with less effective resistance, setting the second word line to 0 V for selectively turning on the first Flash transistor and the second Flash transistor depending on corresponding threshold voltage states for setting respective voltage levels of the first data node and the second data node without changing data polarity.

14. The 14T PMOS NVSRAM memory cell of claim 13 wherein the first data node is set to 0V and the second data node is set to the VDD voltage if correspondingly the first Flash transistor with a threshold voltage of about −2V or lower is turned on and the second Flash transistor with a threshold voltage of about 2V or greater is turned off by commonly applying VSS to the second word line, applying a negative voltage of about −5V to both the first select-gate control line and the second select-gate control line, and coupling the pass-control line to the VDD voltage plus about 2V margin if each of the pair of Pass transistors is a LV NMOS transistor.

15. The 14T PMOS NVSRAM memory cell of claim 13 wherein the data-loading operation from the Flash cell into the SRAM cell is initiated following a power-on period whenever a powerline voltage of the SRAM cell is detected to ramp up from 0V to 70% of the VDD voltage of 1.2V to 1.8V or higher, the initiated data loading operation being associated with a control bias condition including setting the VDD voltage to the common N-well region, coupling VDD+2V to the pass-control line, setting a negative voltage of about −5V to both the first select-gate control line and the second select-gate control line, and keeping 0 V at the first word line and the second word line.

16. The 14T PMOS NVSRAM memory cell of claim 1 wherein each of the pair of LV CMOS transistors is a PMOS transistor being commonly gated by the pass-control signal line set at the VDD voltage for isolating the SRAM cell from each Flash string of the Flash cell during an operation for erasing the Flash cell data and during normal SRAM Read/Write cycle.

17. The 14T PMOS NVSRAM memory cell of claim 1 wherein each of the pair of Pass transistors can be a LV PMOS transistor having an N-well region not shared with the common N-well region of the Flash cell but having a common gate coupled to the pass-control line set at the VDD voltage for isolating the SRAM cell from each Flash string of the Flash cell.

18. A method for operating a PMOS NVSRAM memory cell with a low power-voltage VDD, comprising:
coupling a first word line of both a first data node and a second data node of a SRAM cell through common gates of a first access NMOS transistor and a second access NMOS transistor;
providing a first Flash string of three-PMOS transistors and a second Flash string of three-PMOS transistors respectively connecting in series with the first data node and the second data node, each Flash string including a Flash transistor sandwiched by a top select-gate transistor and a bottom select-gate transistor, both Flash strings being configured to be a Flash cell sharing a common N-well region and a common source line;
coupling a second word line to common gates of the pair of Flash transistors;
coupling a first select-gate control line to common gates of the pair of top select-gate transistor;
coupling a second select-gate control line to common gates of the pair of bottom select-gate transistor;
executing one or more PMOS NVSRAM cell operations including a data-loading operation to write data from the Flash cell into the SRAM cell following a timeline after ramping up of the power voltage VDD from 0V to a desired low voltage VDD level ranging from 1.2 V to 1.8V; wherein the data-loading operation includes keeping the first word line to 0V, applying −5V to the first select-gate control line, setting the second word line to 0V, applying −5V to the second select-gate control line, and setting the common N-well region at the VDD level, thereby the data-loading operation forming a conduction state in a Flash transistor having a channel threshold voltage of −2.0V in association with the first/second Flash string to set 0V level to the corresponding first/second data node and also forming a non-conduction state in another Flash transistor having a channel threshold voltage of +2.0V in association with the first/second Flash string to set the VDD level to the corresponding first/second data node; and
comprising executing a program/program-inhibit operation in the Flash cell to write data from the Flash cell to the SRAM cell in the timeline associated with a period of less than 10 ms after an occurrence of a regular power-down event or an unexpected power-loss event when the power voltage VDD drops at least below 70% of the desired VDD level, wherein the erase operation includes setting the first word line to 0 V, applying 0 V to the first select-gate control line, setting the second word line to a negative high voltage ranging from −12 V to −18 V, applying 0V to the second select-gate control line, and setting the common N-well region to trace the power voltage VDD, thereby the program/program-inhibit operation causing the channel threshold voltage of a Flash transistor in the first/second string to change from −2.0 V to +2.0 V if the first/second string corresponds to the first/second data node stored at the VDD level and keeping the channel threshold voltage of another Flash transistor in the first/second string at −2.0 V if the first/second string corresponds to the first/second data node stored at 0V.

19. The method of claim 18 further comprising executing an erase operation in the Flash cell to isolate each Flash string from the SRAM cell and set a Flash channel threshold voltage state of each Flash transistor in each Flash string to a low level of about −2.0 V or lower in a period less than 10 ms in any time of the timeline after the data loading operation, wherein the erase operation includes keeping the first word line to 0V, applying the VDD level to the first select-gate control line, setting the second word line to a positive high voltage ranging from 12 V to 18 V, applying −5V to the second select-gate control line, and setting the common N-well region to 0V.

20. The method of claim 18 further comprising executing a read/write operation within the SRAM cell in a period of the timeline by applying the VDD level to the first word line of both a first data node and a second data node of a SRAM cell through common gates of a first access NMOS transistor and a second access NMOS transistor, wherein the SRAM cell is isolated from each Flash string at least by applying the VDD level to the first select-gate control line.

* * * * *